United States Patent [19]

Kinoshita et al.

[11] Patent Number: 4,965,767
[45] Date of Patent: Oct. 23, 1990

[54] ASSOCIATIVE MEMORY HAVING SIMPLIFIED MEMORY CELL CIRCUITRY

[75] Inventors: Mitsuya Kinoshita; Masaaki Mihara; Toshifumi Kobayashi; Takeshi Hamamoto, all of Hyogo, Japan

[73] Assignee: Mitsubishi Denki Kabushiki Kaisha, Tokyo, Japan

[21] Appl. No.: 380,428

[22] Filed: Jul. 17, 1989

[30] Foreign Application Priority Data

Jan. 13, 1989 [JP] Japan ................................ 1-6832

[51] Int. Cl.⁵ .............................................. G11C 15/00
[52] U.S. Cl. .................................. 365/49; 365/189.05; 365/230.08
[58] Field of Search ................. 365/49, 189.05, 230.08

[56] References Cited

U.S. PATENT DOCUMENTS 3,733,589  5/1973  Thompson ............................ 365/49

FOREIGN PATENT DOCUMENTS 96799  1/1988  Japan .

OTHER PUBLICATIONS

Hiroshi Kodata et al, "An 8 Kb Content-Addressable and Reentrant Memory", Digest of Technical Papers, IEEE International Solid State Circuit Conference, 1985, pp. 42-43.

Ogura et al., "20 kB CAM LSI", Electronics Information Communication Society, 1987 Technical Report CPSY 87-33.

Primary Examiner—Terrell W. Fears
Attorney, Agent, or Firm—Lowe, Price, Leblanc, Becker & Shur

[57] ABSTRACT

A memory cell circuit of an associative memory composed of only four NMOS transistors is disclosed. Each memory cells of the circuit is connected two bit lines, a word line, a match setup line for commanding coincidence detection, and a match line for transferring the results of detection. The data signals are stored in the gate capacity of each of the transistors 3. This simplified memory cell circuit contributes to higher integration of the associative memory.

9 Claims, 9 Drawing Sheets

ML  :  MATCH LINE
ML1 :  MATCH SETUP LINE

ML : MATCH LINE
ML1 : MATCH SETUP LINE

ASSOCIATIVE MEMORY HAVING SIMPLIFIED MEMORY CELL CIRCUITRY

BACKGROUND OF THE INVENTION

1. Field of the Invention

This invention relates in general to an associative memory and, more particularly, to an associative memory having a simplified memory cell circuitry.

2. Description of the Background Art

FIG. 8 shows a circuit diagram showing an example of a memory cell circuit in a conventional associative memory. This memory circuit may be seen for example in a Digest of Technical Papers, pp. 42 to 43, made public in the IEEE International Solid State Circuit Conference held in 1985. Referring to FIG. 8, this memory cell includes a SRAM section constituted by PMOS transistors 13, 14 and NMOS transistors 5 to 8 and adapted for holding data signals, and a coincidence detecting section constituted by NMOS transistors 9 to 12. The SRAM section is connected to a word line WL and bit lines BL, $\overline{BL}$. The coincidence detecting section is connected to a match line ML and bit lines BL, $\overline{BL}$.

When a data signal "1" is to be written during writing in this memory cell, the word line WL and the bit line BL are brought to a level of the source voltage Vcc, referred to hereinafter as the high level, while the bit line $\overline{BL}$ is brought to a level of ground voltage, referred to hereinafter as a low level. Hence, transistors 6 and 14 are turned on, while transistors 7 and 13 are turned off. After the word line WL is brought to the low level, transistors 5 and 8 are turned off, so that the data signal "1" is held in the SRAM section. On the other hand, when a data signal "0" is to be written in this memory cell, the word line WL and the bit line $\overline{BL}$ are brought to the high level, while the bit line BL is brought to the low level.

When the data signal "1" stored in a memory cell is read out during read out operation, the bit lines BL, $\overline{BL}$ are precharged to a voltage Vcc/2. The word line WL is then brought to the high level. Since the data signal "1" is stored in the SRAM section, the nodes B1 and B2 are brought to the low level and the high level, respectively. Thus, after the transistors 5 and 8 are turned on responsive to the high level voltage on the word line WL, the voltages on the bit line BL is increased, while the voltage at the bit line $\overline{BL}$ is decreased. These changes in voltages are amplified by a sense amplifier, not shown, for reading out the signal "1". The read out operation of the data signal "0" is performed in the similar manner.

The coincidence detecting operation is hereinafter explained. In the following explanation, it is assumed that a data signal "1" is stored in the memory cell. First, the coincidence detection line ML is precharged to the source voltage Vcc. The word line WL is brought to the ground voltage. Since the signal "1" is held in the SRAM section, transistor 10 is turned off, while transistor 12 is turned on. In this state, data signals for comparison are supplied to this memory cell via bit lines BL and $\overline{BL}$. For example, when a comparison data signal "1" is supplied for comparison, the bit line BL is brought to the high level, while the bit line $\overline{BL}$ is brought to the low level. As described above, the transistors 10 and 12 are turned off and on, respectively, responsive to the data signal "1" stored in this memory cell. The transistors 9 and 11 are turned on and off, respectively, responsive to the high level voltage on the bit line BL and the low level voltage on the bit line $\overline{BL}$, respectively. As a result, the coincidence detection line ML is not connected to ground via transistors 9 to 12.

On the other hand, when a comparison data signal "0" is supplied for comparison, the bit line BL is brought to the low level, while the bit line $\overline{BL}$ is brought to the high level. The transistor 11 is turned on responsive to the high level voltage on the bit line $\overline{BL}$. Thus, the coincidence detection line ML is connected to ground via transistors 11 and 12, so that the coincidence detection line ML is brought to the low level.

The operation for coincidence detection when the data signal "0" is stored in the memory cell is performed in the similar manner, so that the description is omitted for simplicity.

Since the voltage on the coincidence section line ML is changed in this manner responsive to the results of comparison of data signal, the result of comparison may be detected by detecting the voltage on the match line ML.

FIG. 9 shows a circuit diagram showing another example of a memory circuit of a conventional associative memory. This example may be seen for example in a thesis entitled "20 kB CAM LSI", pp. 31 to 37, by Ogura et al in a technical report CPSY 87-33 of the Electronics Information Communication Society of 1987. Referring to FIG. 9, this memory cell include a SRAM section constituted by NMOS transistors 15 to 18 and registers 22 and 23, and a coincidence detecting section constituted by NMOS transistors 19 to 21. The SRAM section is connected to a word line WL and bit lines BL and $\overline{BL}$. The coincidence detecting section is connected to data search lines SL and $\overline{SL}$ supplied with data search signal and to the match detection line ML.

During the operation for coincidence detection, the data search signals of opposite signs or polarities are supplied to the data search lines SL and $\overline{SL}$. Since the data signal is held in the SRAM section, one of nodes C1 and C2 is brought to the high level. When the voltage at the node C2, for example, is at the high level, transistor 19 is turned on upon application of search data setting a high level voltage at the node C2. Thus, the coincidence detection line ML is brought to the low level voltage. Thus, in the memory cell shown in FIG. 9, the operation of coincidence detection may be performed similarly to the case of the memory cell of FIG. 8.

In the memory cells shown in FIGS. 8 and 9, ten and nine devices are used, respectively. Since the number of devices necessary for each cell in the conventional associative memory is not small, so that the circuitry is complicated. As a result, difficulties are presented in elevating the degree of integration of associative memories.

A prior art example having a particular reference to the present invention may be seen in the Japanese Patent Publication Gazette No. 96799/1988. This prior art example shows an associative memory including a complementary memory cell circuit in which the operation for coincidence detection can be performed without the necessity of using signals for commanding the operation of coincidence detection.

SUMMARY OF THE INVENTION

It is a primary object of the present invention to provide an associative memory in which the memory cell circuit is simplified.

It is another object of the present invention to provide an associative memory in which the number of devices required to be used in the memory cell circuit may be decreased.

It is another object of the present invention to provide an associative memory having a high degree of integration.

Briefly stated, the associative memory according to the present invention includes first and second bit lines each connected to at least one memory cell, a word line, a command line for transmitting a command signal commanding the operation for coincidence detection to the memory cell, and a coincidence detection line for outputting a signal indicating the result of coincidence detection from the memory cell. The memory cell includes a data holding section for holding data signal on the first bit line responsive to the word line signal, a first switching device connected between the coincidence detection line and a predetermined first potential, a first control section responsive to the signal on the command line to control said first switching device, and a second control section responsive to the data signal held in said data holding section to control said first switching device.

Since the memory cell is formed by circuit means which is simplified, the circuitry of the associative memory may be simplified.

In one aspect of the present invention, the associative memory includes first and second bit lines each connected to at least one memory cell, a word line, a command line for commanding the operation of coincidence detection to the memory cell, and a coincidence detection line for outputting a signal indicating the result of coincidence detection from the memory cell. Each memory cell includes first and second field effect transistors connected in series between the first and second bit lines, a third field effect transistor connected between the first bit line and the gate of the second field effect transistor, and a fourth field effect transistor connected between the coincidence detection line and a predetermined potential. The first field effect transistor has its gate connected to the command line. The second field effect transistor has a first gate capacity formed between its gate and the predetermined potential. The third field effect transistor has its gate connected to the word line. The fourth field effect transistor has its gate connected to a connection node between the first and second field effect transistors. The fourth field effect transistor has a second gate capacity formed between its gate and the predetermined potential. Hence, this associative memory is formed by only four field effect transistors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
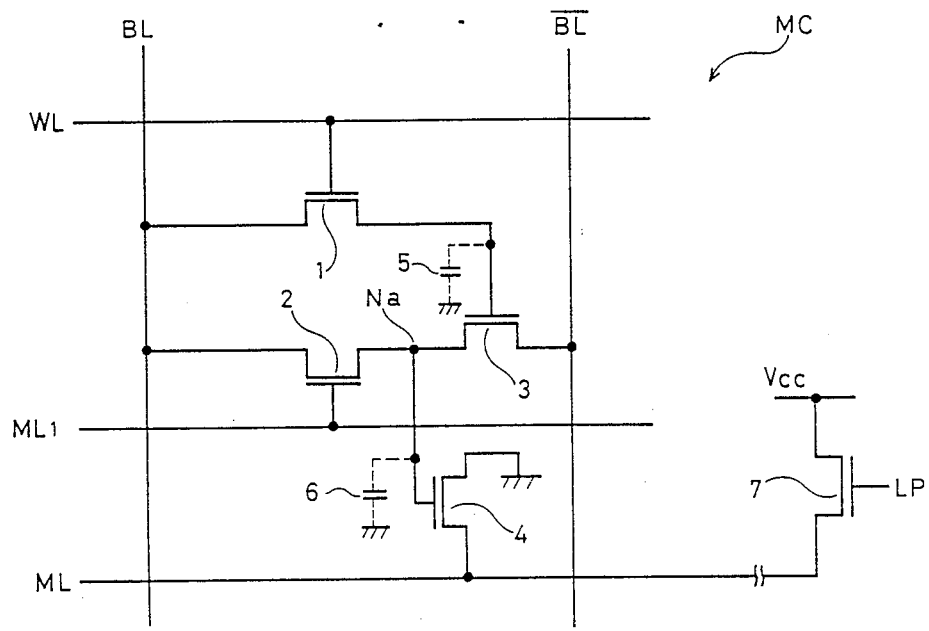
FIG. 1 is a circuit diagram of a memory cell in an associative memory according to an embodiment of the present invention.

FIG. 1 shows a circuit diagram of the memory cell in an associative memory according to an embodiment of the present invention. Referring to FIG. 1, the memory cell MC includes NMOS transistors 2, 3 connected in series between the bit lines BL and $\overline{BL}$, a NMOS transistor 1 connected between the bit line BL and the gate of the transistor 3, and a NMOS transistor 4 connected between the match line ML and the ground potential. The transistor 1 has its gate connected to the word line WL. The transistor 2 has its gate connected to a match setup line ML 1. The transistor 4 has its gate connected to a connection node Na between transistors 2 and 3. The transistors 3 has a gate capacity 5 between its gate and the ground potential. The transistor 4 has a gate capacity between its gate and the ground potential. The transistor 1 and the capacity 5 make up a data holding circuit. The transistors 2 to 4 and the capacity 6 make up the coincidence detection circuit. The match setup line ML1 is supplied with a pulse commanding the operation of coincidence detection by a setup line driving circuit as later described. A NMOS transistor 7 for precharging the match line ML is connected between the source potential Vcc and the match line ML.

The operation of the present embodiment is hereinafter explained.

It is assumed that a data signal "1" is written in the memory cell in the write operation. The word line WL and the bit line BL are brought to a level of a source voltage Vcc, referred to hereinafter as the high level, while the bit line $\overline{BL}$ is brought to a ground potential, referred to hereinafter as a low level. The match setup line ML1 is also brought to the low level. The transistor 1 is turned on responsive to the voltage on the word line WL, so that the gate capacity 5 of the transistor 3 is charged by the high level voltage on the bit line BL. From this time on, the voltage on the word line WL is decreased, so that transistor 1 is turned off. The charges held by the gate capacity 5 are lost gradually by leakage, so that a refreshing operation such as is utilized in the well-known dynamic random access memories is performed heriodically to maintain the data signals. On the other hand, when a data signal "0" is written, the bit line BL is brought to the low level, while the bit line $\overline{BL}$ is brought to the high level. The low level voltage is maintained in the gate capacity 5 of transistor 3, in the similar manner as above.

The operation of reading out the data signal "1" is hereinafter explained. When the voltage on the word line WL is at the low level, both the bit lines BL and $\overline{BL}$ are previously brought to the voltage Vcc/2. The match setup line ML1 is brought to the low level. When the voltage on the word line WL is raised to the high level, transistor 1 is turned on. Thus, the positive charges stored in the gate capacity 5 of transistor 3 are supplied to the bit line BL, so that the voltage on the bit line BL is increased. This voltage change is amplified by a sense amplifier. When a data signal "0" is read out, the charges on the bit line BL flow into the gate capacity 5 via transistor 1, so that the voltage on the bit line BL is decreased. Thus, the voltage changes on the bit line BL are similarly amplified by the sense amplifier.

The operation of detecting the coincidence is hereinafter explained.

Figure 2:
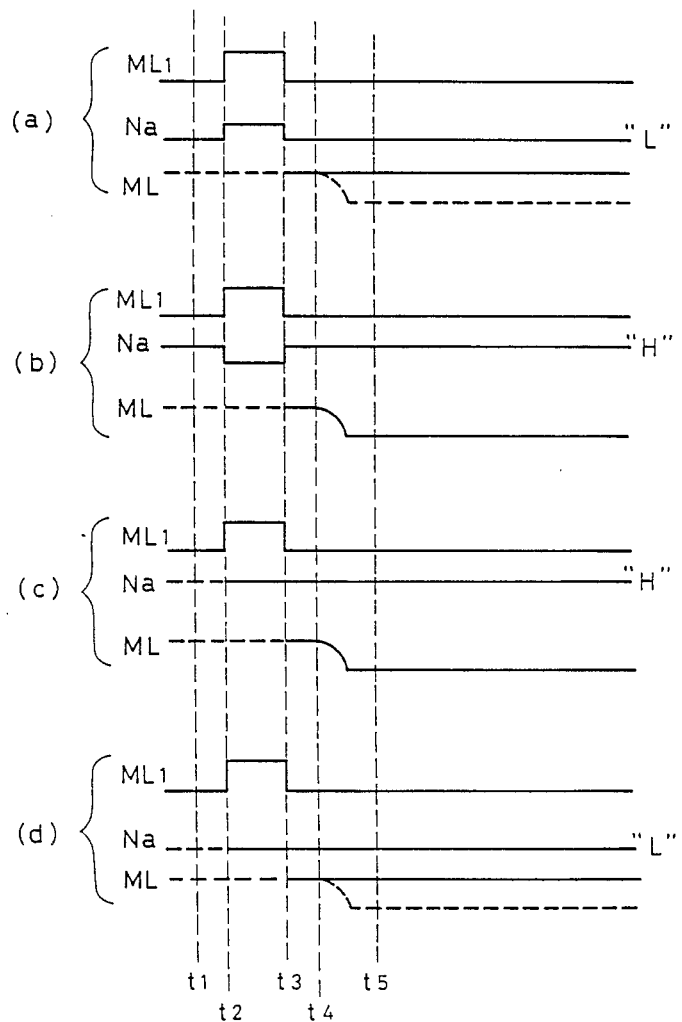
FIG. 2 is a timing chart for illustrating the operation of coincidence detection of the memory cell shown in FIG. 1.

FIG. 2 is a timing chart for illustrating the operation of coincidence detection of the memory cell shown in FIG. 1. In FIG. 2(a), a data signal "1" is stored in the memory cell and a comparison data signal "1" is supplied for retrieval. In FIG. 2(b), a data signal "1" is stored, and a comparison data signal "0" is supplied. In FIG. 2(c), a data signal "0" is stored, and a comparison data signal "1" is supplied. In FIG. 2 (d), a data signal "0" is stored, and a comparison data signal "0" is supplied.

In any of the cases shown in FIG. 2(a) to (d), the transistor 7 is turned on initially responsive to the high level precharge signal LP, while the match line ML is brought to the high level. In addition, the word line WL is brought to the low level, so that transistor 1 continuous to be turned off.

In the case shown in FIG. 2(a), the comparison data signal is "1", so that the bit lines BL and $\overline{BL}$ are brought to the high and low levels, respectively. At this time, a pulse signal commanding the operation for coincidence detection is supplied to the match setup line ML1 by a setup line driving circuit 28 as later described. That is, as shown in FIG. 2 (a), the voltage on the match setup line ML 1 is at the low level at time t1, and brought to the high level during the period of time of from t2 to t3. Thus, the transistor 2 is turned on during the period of time of from t2 to t3. On the other hand, transistor 3 is turned on responsive to the high level voltage maintained by the gate capacity 5. Thus, during the period from time t2 to time t3, the node Na is brought to an intermediate voltage Vcc/2 determined by the turn-on resistance of the transistors 2 and 3 in the conducting state. After time t3, transistor 2 is again turned off, so that the node Na is again brought to the low level. At time t4, transistor 7 is turned off responsive to the low level precharge signal LP, so that the match line ML is brought to the floating state. Since the transistor 4 is turned off responsive to the low level voltage at the node Na, the voltage of the match line ML is not changed by the result of coincidence detection of the memory cell.

In the case shown in FIG. 2(b), the bit line BL is brought to the low level, while the bit line $\overline{BL}$ is brought to the high level. Thus, during the period of time from t2 to t3, the node Na is brought to the intermediate voltage Vcc/2, after which the voltage at the node Na is changed to the high level. The transistor 4 is turned on responsive to the high level voltage at the node Na. Thus, the voltage on the match line ML falls after time t4.

In the case shown in FIG. 2(c), a low level voltage is maintained in the gate capacity 5 of transistor 3, so that transistor 3 continues to be turned off. In this case, by way of a comparison data signal "1", the bit line BL is brought to the high level, while the bit line $\overline{BL}$ is brought to the low level. Thus, after time t2, the voltage at the node Na is maintained at the high level. The transistor 4 is turned on responsive to the high level voltage at the node Na, so that the voltage on the coincidence detection line ML falls to the low level.

In the case of FIG. 2(d), the bit line BL is brought to the low level, while the bit line $\overline{BL}$ is brought to the high level. Thus, the node Na is maintained at the low level after time t2, so that the transistor 4 continues to be turned off. As a result, the voltage on the coincidence detection line ML is not changed by the result of coincidence detection of the memory cell.

It will be appreciated from above that, when the data signal stored in the memory cell coincides with the comparison data signal, the voltage on the match line ML is maintained at the high level, under that, when the two data signals are not coincident with each other, the voltage on the match line ML falls to the low level.

Figure 3:
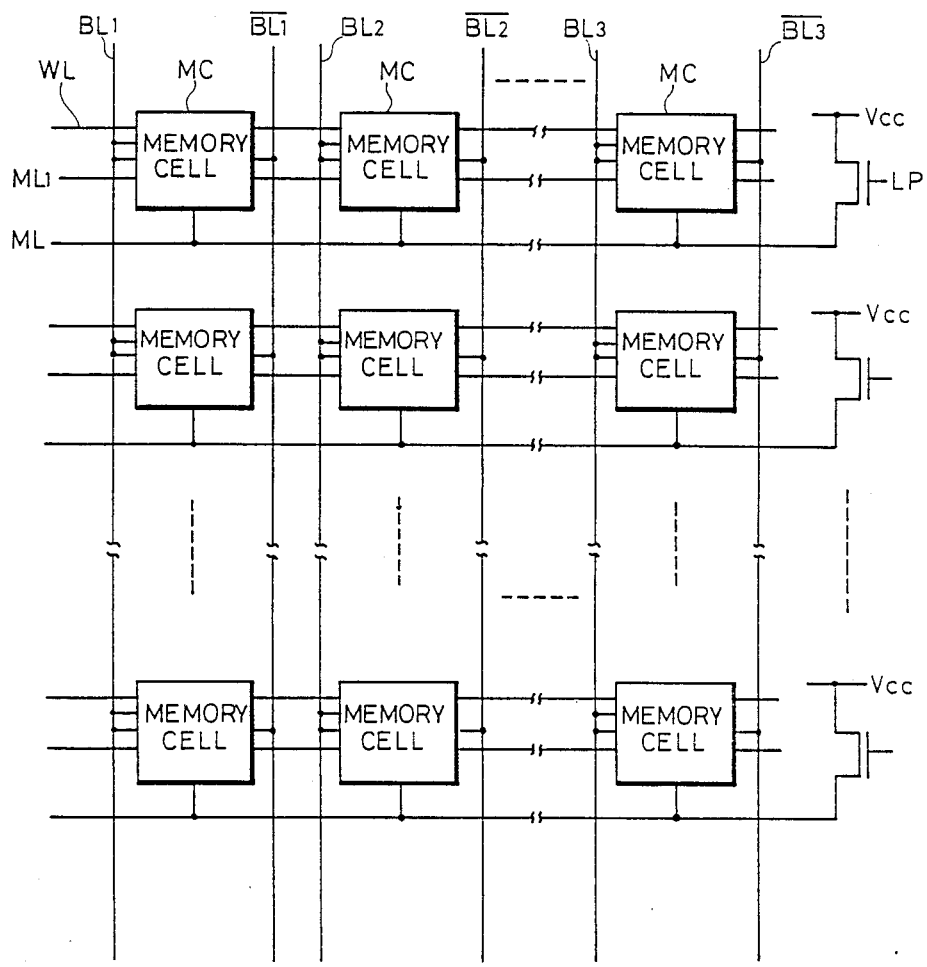
FIG. 3 is a circuit diagram showing a memory array constituted by a plurality of the memory cells shown in FIG. 1.

FIG. 3 shows a circuit diagram showing a memory array constituted by a number of memory cells MC shown in FIG. 1. Referring to FIG. 3, a plurality of memory cells MC are provided in the memory array along a word line WL. Thus, a word line WL, a match line ML and a match setup line ML 1 are connected in common to the memory cells MC in each row of the memory array. Bit line pairs BL1 and $\overline{BL1}$ to BL3 and $\overline{BL3}$ are connected to the respective memory cells MC.

In the operation of coincidence detection, the data signals stored in the memory cells MC and the respective comparison data signal supplied via the bit line pairs are compared to each other. When the two signals coincide in all of the memory cells MC, the match line ML continues to be brought to the high level. Conversely, when the signals are not coincident in at least one memory cell MC, the voltage on the match line ML is changed to the low level. Thus, by detecting the voltage on the match line ML following the operation of coincidence detection, it can be checked whether the data stored in the memory cell coincides with the comparison data.

The broken lines shown in FIGS. 2(a) and (d) indicate that the coincidence has not been achieved in the respective other memory cells, that is, that the voltage on the coincidence detection line ML is changed to the low level responsive to the results in the other memory cells.

When the memory cell shown in FIG. 1 is employed in the associative memory, its masking function may be realized in the following manner. When the memory cell shown in FIG. 1 is masked, the two bit lines BL and $\overline{BL}$ are brought to the low level. As a result, the transistor 4 is not turned on despite the results of coincidence detection.

Figure 4:
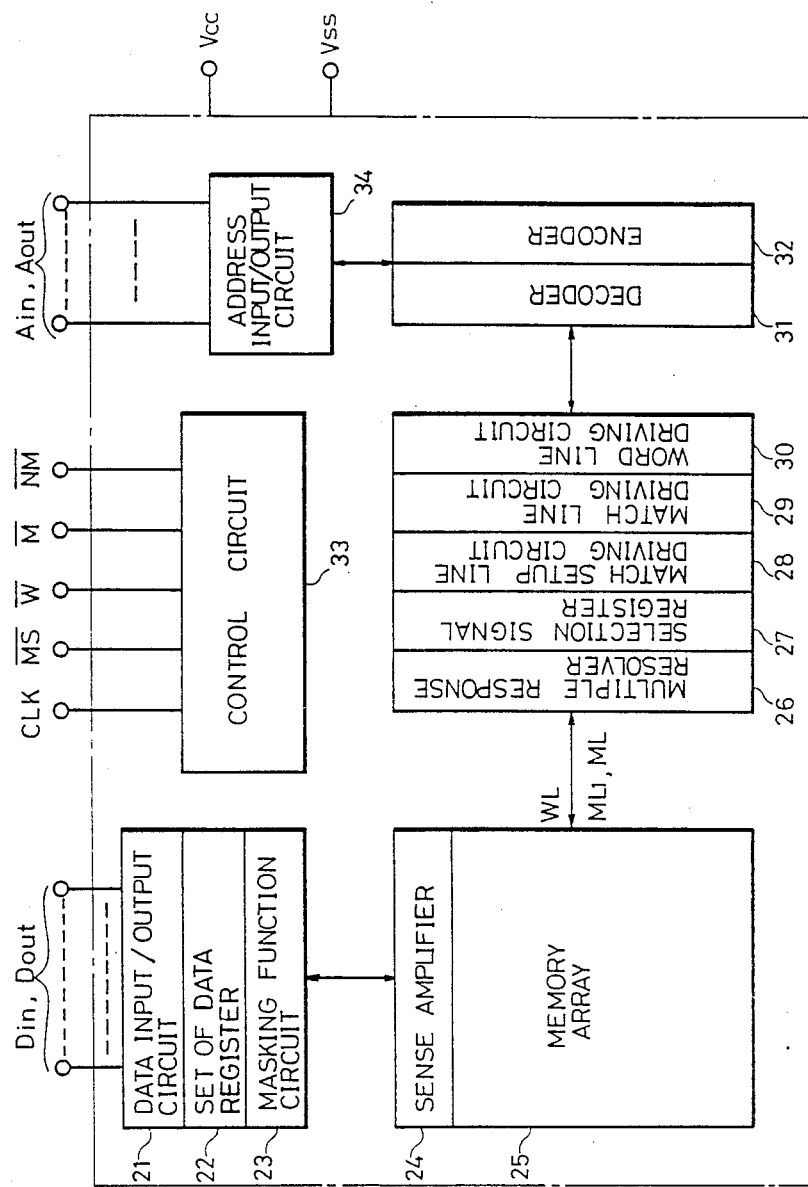
FIG. 4 is a block diagram showing an associative memory to which the memory cell circuitry shown in FIG. 1 is applied.

FIG. 4 shows in a block diagram an associative memory to which the memory cell circuitry shown in FIG. 1 is applied. Referring to FIG. 4, this associative memory includes a memory array 25 comprised of a large number of memory cells shown in FIG. 1, a sense amplifier 24 connected via the bit line pairs to the memory cells, a control circuit 33 for controlling the operation of the associative memory, and other peripheral circuits. These peripheral circuit includes a word line drive circuit 30 for driving the word lines WL shown in FIG. 1, a circuit 29 for precharging the match line ML, a setup line driving circuit 28 for driving the match setup line ML1 and a masking function circuit 23 for controlling the voltage on the bit line pairs for masking function. The peripheral circuits, there are also provided in this associative memory on input/output circuit 21, a set of data registers 22, an address input/output circuit 34, a multiple response resolver 26, a selected signal register 27, a decoder 31, and an encoder 32. The number of the terminals for data input and data output is equal to the number of bits constituting each word in the associative memory. The number of terminals for address input and address output is determined by the number of words in this associative memory.

The operational modes of these associative memory are designated by externally supplied clock signals CLK, a read/write control signals $\overline{W}$, and an operation designation signal $\overline{MS}$. That is, when the reading operation is designated, high level signals $\overline{MS}$ and $\overline{W}$ are supplied to this associative memory before falling of the signal CLK. When the write operation is designated, a high level signal $\overline{MS}$ and a low level signal $\overline{W}$ are supplied before falling of the signal CLK. When the operation of coincidence detection is designated, a low level signal $\overline{MS}$ is applied before falling of the signal CLK. The signal $\overline{W}$ does not affect the designation of the operation for coincidence detection.

The signal $\overline{M}$ indicates to outside that this associative memory is operating in the coincidence detection mode. What is, when the signal $\overline{M}$ is at the low level, the associative memory is operating in the match detection mode. A signal $\overline{NM}$ outputs the results of coincidence detection to outside. Thus, when the signal $\overline{NM}$ is at the high level, at least one word coincident with the supplied comparison data signal is stored in this associative memory. Conversely, other hand, when the signal $\overline{NM}$ is at the low level, no word coincident with the comparison data signal is stored in this associative memory.

Figure 5:
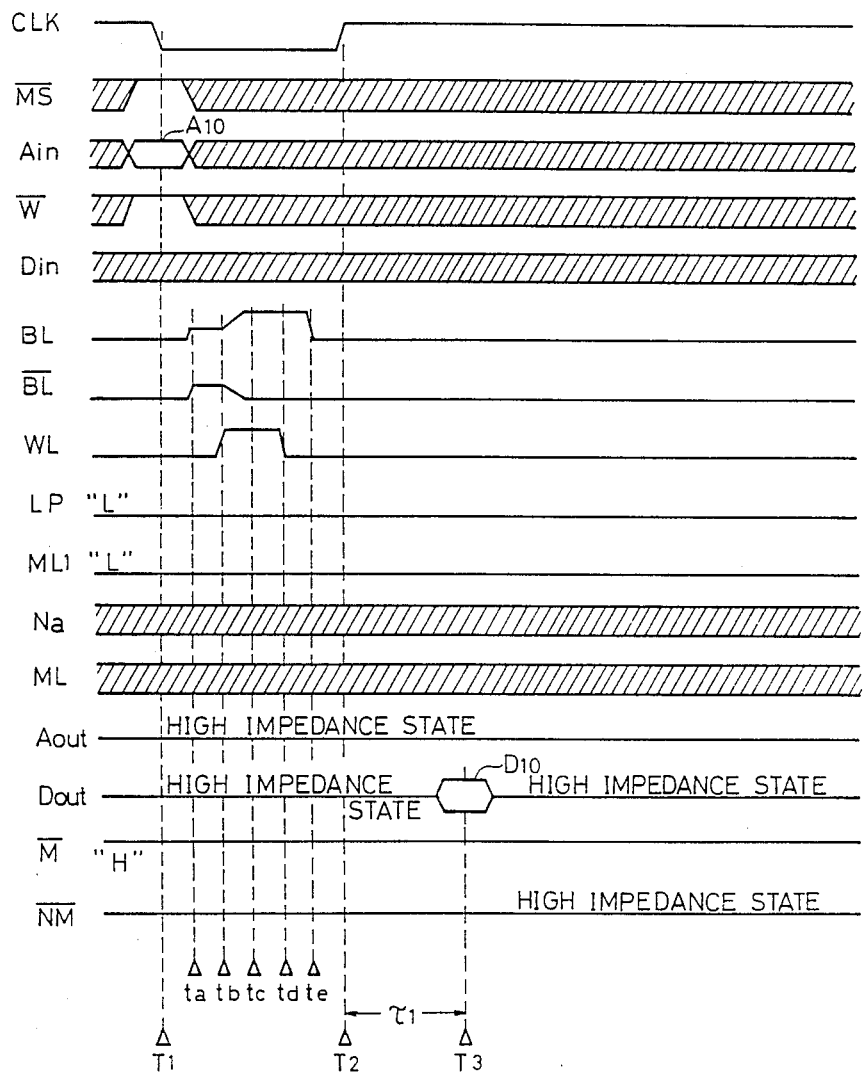
FIG. 5 is a timing chart for illustrating the read out operation of the associative memory shown in FIGS. 1 and 4.

FIG. 5 is a timing chart for illustrating the read out operation of the associative memory shown in FIGS. 1 and 4. Referring to FIG. 5, when the clock signal CLK falls at a time T1, the operation designation signal $\overline{MS}$ and read/write control signal $\overline{W}$ are at the high level, so that the designation of the read out operation is detected. Then, at time T1, a read out address signal A10 is supplied to an address input/output circuit 34. At time ta, precharging is started, so that the bit line pair BL, $\overline{BL}$ are brought to the voltage Vcc/2. At time tb, the voltage on the word line WL is brought to the high level. Since the high level data signal is stored in the memory cell, the voltage on the bit line BL and the voltage on the bit line $\overline{BL}$ are brought to the high and low levels, respectively at the time tc, by the sense amplifier. After the voltage signals indicated by these bit lines BL, $\overline{BL}$ are stored in the data register 22, the word line WL is brought to the low level at the time td. Then, in readiness for subsequent operations, the bit lines BL, $\overline{BL}$ are brought to the low level at time te. The signal D10 stored in the data register 22 is outputted via the data output terminal after time $\tau1$ after rising of the signal CLK at the time T2.

Figure 6:
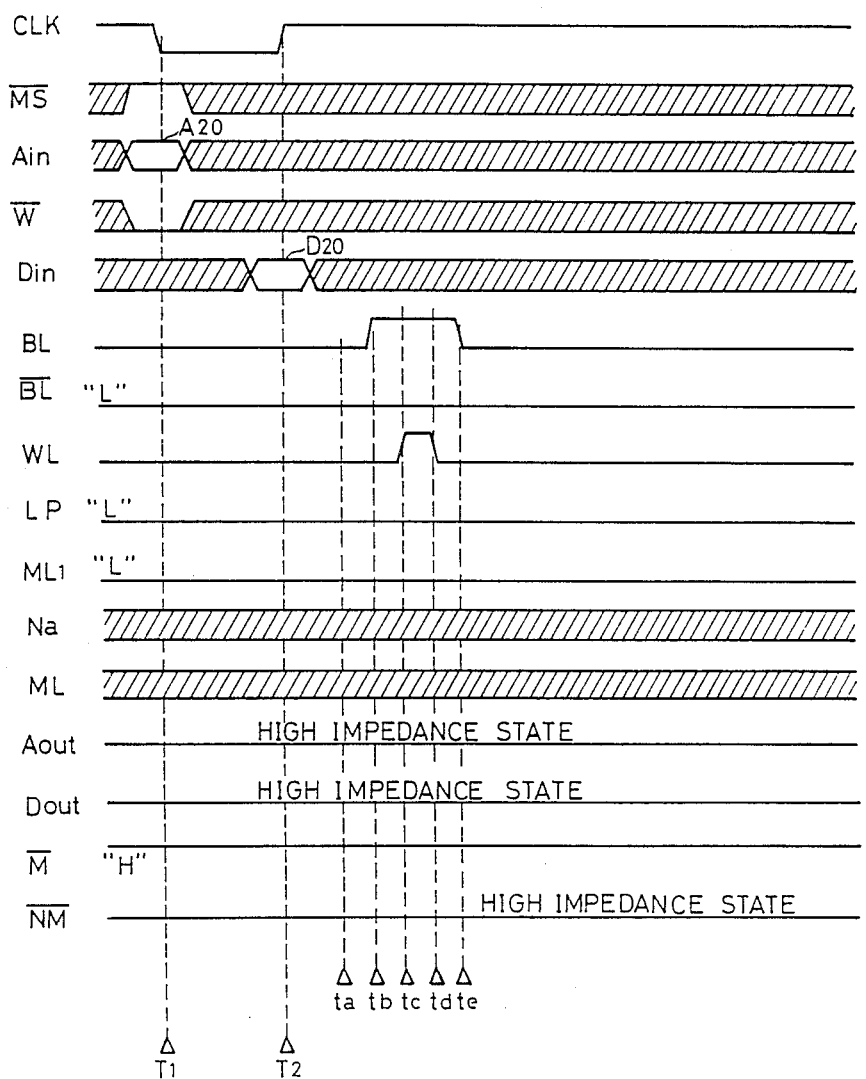
FIG. 6 is a timing chart for illustrating the write operation of the associative memory shown in FIGS. 1 and 4.

FIG. 6 is a timing chart for illustrating the write operation of the associative memory shown in FIGS. 1 and 4. Referring to FIG. 6, when the signal CLK falls at time T1, the signal $\overline{MS}$ is at the high level voltage, while the signal $\overline{W}$ is at the low level, so that designation of the write operation is detected. At time T1, the write address signal A20 is supplied to the address input/output circuit 34. At time T2, the signal CLK rises, at the same time that the write data signal D20 is supplied to the data input/output circuit 21. When the 1-bit write data signal is a signal "1", the bit line BL is brought to the high level, while the bit line $\overline{BL}$ is brought to the low level at the time tb. At time tc, the word line WL is brought to the high level, so that the data signal is stored in the memory cell. At time td, the write operation is completed and the voltage on the word line WL falls to the low level. At time te, the bit line pair BL, $\overline{BL}$ is brought to the low level for readying for subsequent operations.

Figure 7:
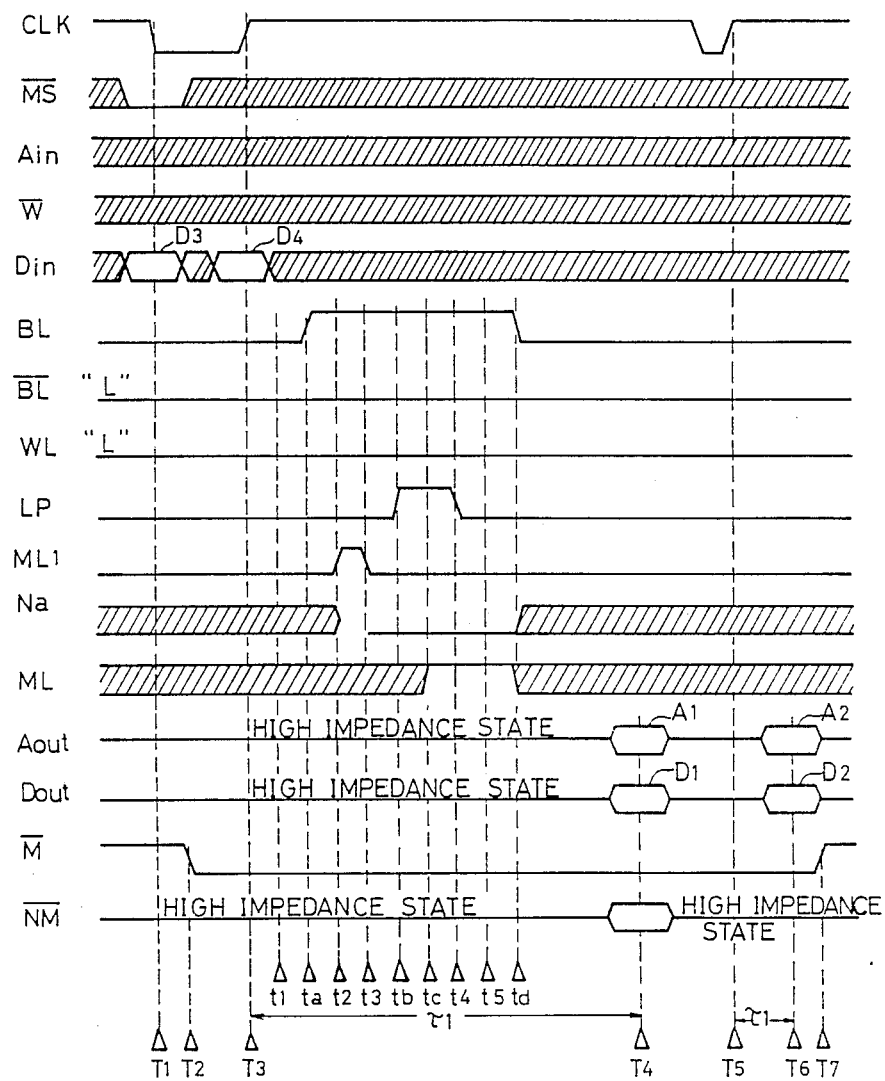
FIG. 7 is a timing chart for illustrating the operation of coincidence detection of the associative memory shown in FIGS. 1 and 4.
Figure 8:
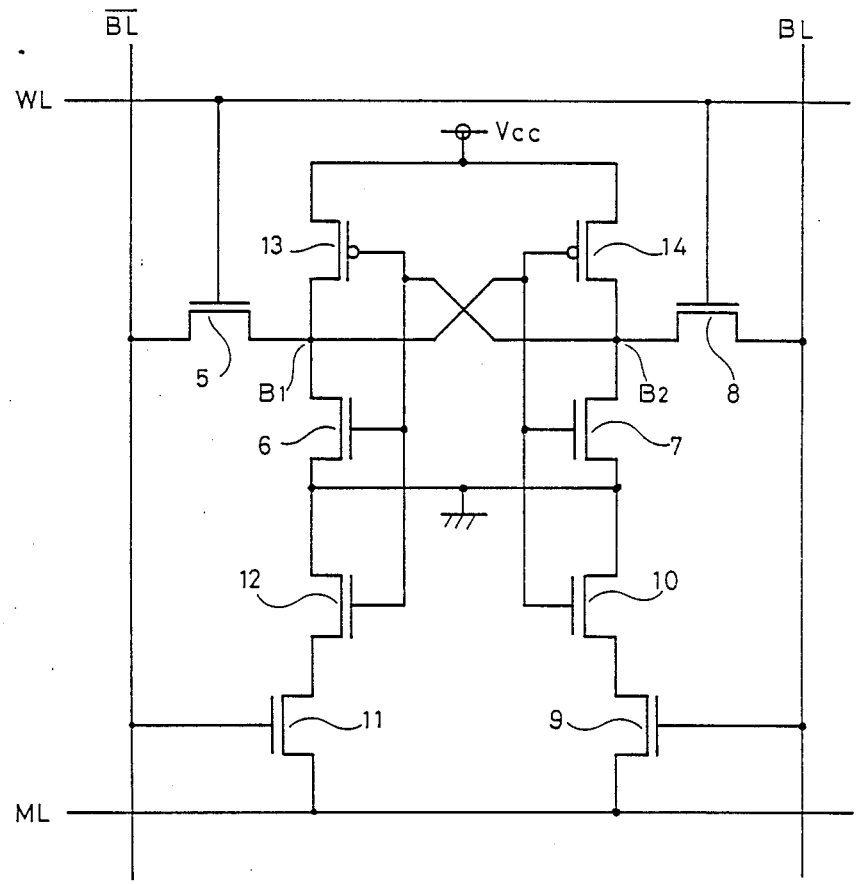
FIG. 8 is a circuit diagram showing an example of the memory cell circuitry in a conventional associative memory.
Figure 9:
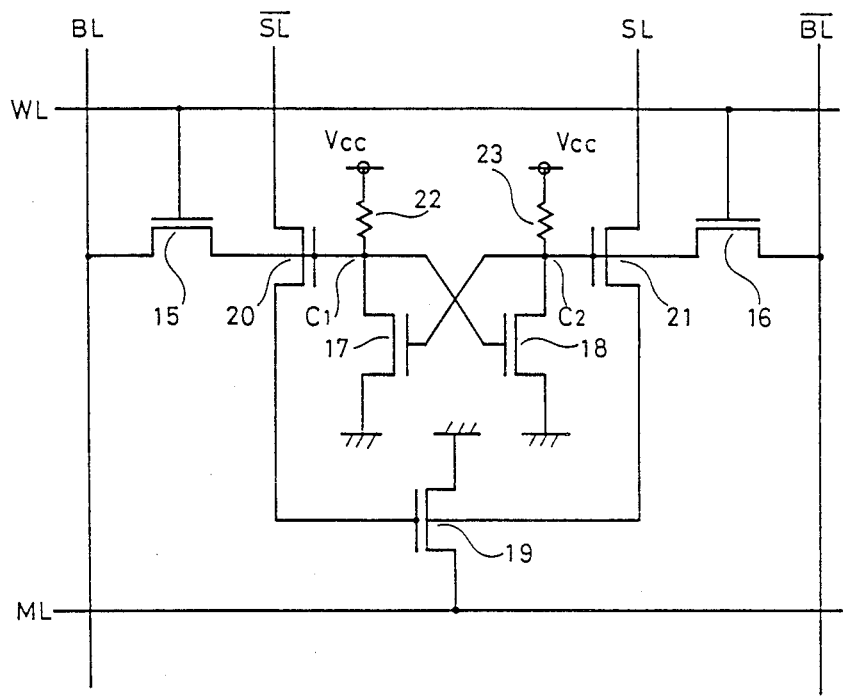
FIG. 9 is a circuit diagram showing another example of the memory cell circuitry of a conventional associative memory.

FIG. 7 is a timing chart for illustrating the operation of coincidence detection of the associative memory shown in FIGS. 1 and 4. The example shown in FIG. 7 corresponds to the operation of coincidence detection shown in FIG. 2(a). Referring to FIG. 7, when the signal CLK falls at the time T1, the signal $\overline{MS}$ is at the low level, so that designation of the operation or coincidence detection is detected. At time T1, a match data signal D3 of a comparison data signal is supplied to the data input/output circuit 21. At time T2, the low level signal $\overline{M}$ is outputted from this associative memory. At time T3, the signal CLK rises, at the same time that a mask data signal D4 is supplied. From the supplied data signal, the mask data signal D4 designates the bit line desired to be disregarded in the operation of coincidence detection. For example, the mask data signal [0110] designates that the second and third bits of the data signal should be disregarded in the operation for coincidence detection. In the following description, the operation of the unmasked memory cell is explained.

At time ta, a voltage corresponding to the comparison data signal is supplied to the memory cell. Thus, the bit line BL is brought to the high level, while the bit line $\overline{BL}$ is brought to the low level. At time t2, the match setup line ML1 is brought to the high level voltage, while the node Na is brought to the intermediate voltage. At time t3, the voltage on the setup line ML1 falls to the low level, so that the node Na is brought to the low level. At time tb, the precharge signal LP rises to the high level, and precharging on the match line ML is started to terminate at the time tc. After the signal LP falls to the low level at time t4, the voltage at the node Na is at the low level, so that the voltage on the match line ML is maintained at the high level. It is herein assumed that the coincidence is detected in other memory cells of the designated word. At time t5, the result of coincidence detection is stored in the data register 22. At time td, the bit line pair BL, $\overline{BL}$ is brought to the low level, for readying for subsequent operations. The above described operation is executed since time t3 until time $\tau1$.

When the time $\tau1$ has elapsed since the rising of the signal CLK, the address signal Al of the word for which the coincidence has been detected at the time T4, is outputted via the address input/output circuit 34. Simultaneously, the data signal stored in the address is outputted via the data input/output circuit 21. The reason why the data signals are outputted simultaneously is that a plurality of kinds of data signals are detected in the operation for coincidence detection accompanied by the masking function. For example, when the mask data signal [0110] and comparison data [1010] are supplied, coincidence is detected for any of the data signals [1001], [1011], [1101] and [1111].

When the comparison data signal is coincident with the plural data signals stored in the memory cell, the remaining next address signal A2 and data signal D2 are outputted at time T6 or after lapse of time $\tau 1$ since the next rising of the signal CLK at time T5. In the case shown in FIG. 7, two coincidences are detected, so that the signal $\overline{M}$ rises at time T7, and the end of the operation for coincidence detection may be recognized from outside. It is noted that, at time T4, the signal $\overline{NM}$ is at the high level if at least one coincidence is detected, and at the low level if no coincidence is detected. In this case when no coincidence is detected, the signal $\overline{M}$ rises to the high level, so that the operation for coincidence detection is terminated.

Although the NMOS transistor is applied in the memory cell circuit in the embodiment of FIG. 1, it may be replaced by the PMOS transistor. In this case, all the voltages supplied to the bit lines BL, $\overline{BL}$, word line WL and match setup line ML1 are the voltages inverted from the corresponding voltages shown in FIG. 2.

From the foregoing it is seen that the memory cell circuit of the associative memory shown in FIG. 1 is composed of only four field effect transistors 1 to 4, so that the number of devices is decreased as compared to the conventional memory cell circuit, with the result that the memory cell circuit of the associative memory is simplified and higher integration of the associative memory may be facilitated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An associative memory including at least one memory cell which can be accessed for reading, writing and coincidence detection, said associative memory comprising:
    first and second bit lines connected to said memory cell,
    a word line connected to said memory cell,
    command means for generating a command signal for commanding said coincidence detection,
    a command line connected between said command means and said memory cell for transmitting the command signal generated by said command means to said memory cell, and
    a match line connected to said memory cell adapting from said memory cell for outputting from said memory cell a signal indicating the result of coincidence detection,
    said memory cell including,
    data holding means connected to said first bit line responsive to the signal on said word line for holding the data signal on said first bit line,
    a first switching device connected between said match line and a predetermined first potential,
    first control means connected to said first bit line responsive to the command signal supplied by said command line for controlling said first switching device, and
    second control means connected to said second bit line responsive to the data signal held in said data holding means for controlling said first switching device.

2. The associative memory according to claim 1 wherein
    said first switching device includes a control electrode,
    said first control means include a second switching device having a control electrode and connected between said first bit line and the control electrode of said first switching device,
    said second switching device has its control electrode connected to said command line, and
    said second control means includes a third switching device having a control electrode and connected between said second bit line and the control electrode of said first switching device,
    said third switching device having its control electrode connected to said data holding means,
    said memory cell further including a first capacity means connected between the control electrode of said first switching device and said first potential.

3. The associative memory according to claim 1, wherein the command signal generated by said command means includes pulse signal includes a pulse signal having a predetermined pulse width.

4. The associative memory according to claim 2, wherein said data holding means includes
    a fourth switching device having a control electrode and connected between said first bit line and the control electrode of said third switching device,
    said fourth switching device having its control electrode connected to said word line, and
    a second capacity means connected between the control electrode of said third switching device and said first potential.

5. The associative memory according to claim 4, wherein said first to fourth switching device each include first to fourth field effect devices of one conductivity type each having a gate electrode.

6. The associative memory according to claim 4, wherein
    said first capacity means include a first gate capacity formed between the gate electrode of said first field effect device and said first potential, and
    said second capacity means includes a second gate capacity formed between the gate electrode of said third field effect device and said first potential.

7. The associative memory according to claim 4, wherein
    said one conductivity type include a N type, and
    said first potential includes a ground potential.

8. An associative memory including at least one memory cell which can be accessed for reading, writing and coincidence detection, said associative memory comprising:
    first and second bit lines connected to said memory cell,
    a word line connected to said memory cell,
    command means for generating a command signal for commanding said coincidence detection,
    a command line connected between said command means and said memory cells for transmitting said command signal generated by said command means to said memory cell, and
    a coincidence detection line connected to said memory cell for outputting from said memory cells a signal showing the results of coincidence detection,
    said memory cell including
    first and second field effect transistors of one conductivity type each having a gate electrode connected in series between said first bit line and second bit line,
    said first field effect transistor having its gate electrode connected to said command line, said second field effect transistor having a first gate capacity formed between the gate electrode of said second field effect transistor and a predetermined first potential, a third field effect transistor having a gate electrode connected between said first bit line and the gate electrode of said second field effect transistor, said third field effect transistor having its gate electrode connected to said word line, and a fourth field effect transistor having a gate electrode connected between said coincidence detection line and said first potential, said fourth field effect transistor having its gate electrode connected to a connection node between said first and second field effect transistors, said fourth field effect transistor having a second gate capacity formed between the gate electrode of said fourth field effect transistor and said first potential.

9. The associative memory according to claim 8, wherein said one conductivity type includes a N type, and said first potential includes a ground potential.

* * * * *